United States Patent
Kirchev

(10) Patent No.: US 8,589,097 B2
(45) Date of Patent: Nov. 19, 2013

(54) METHOD FOR DIAGNOSING THE STATE OF HEALTH OF A BATTERY

(75) Inventor: Angel Zhivkov Kirchev, Aix-les-Bains (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/522,148

(22) PCT Filed: Jan. 26, 2011

(86) PCT No.: PCT/FR2011/000051
§ 371 (c)(1),
(2), (4) Date: Jul. 13, 2012

(87) PCT Pub. No.: WO2011/092403
PCT Pub. Date: Aug. 4, 2011

(65) Prior Publication Data
US 2012/0296586 A1 Nov. 22, 2012

(30) Foreign Application Priority Data
Jan. 27, 2010 (FR) ...................................... 10 00311

(51) Int. Cl.
*G01R 31/36* (2006.01)

(52) U.S. Cl.
USPC ................... 702/63; 702/58; 702/64; 702/79; 702/108

(58) Field of Classification Search
USPC .................. 702/58, 63, 64, 79, 108; 700/297; 340/636.1, 636.21; 324/145, 426; 320/127
See application file for complete search history.

(56) References Cited

U.S. PATENT DOCUMENTS

| | | | |
|---|---|---|---|
| 4,912,416 A | 3/1990 | Champlin | |
| 7,216,044 B2 * | 5/2007 | Kato et al. | ...................... 702/63 |
| 7,795,874 B1 * | 9/2010 | Kirchev | ....................... 324/427 |
| 2007/0194756 A1 | 8/2007 | Cutrona | |

FOREIGN PATENT DOCUMENTS

| | | |
|---|---|---|
| JP | A-7-183050 | 7/1995 |
| WO | WO 2006/107247 A1 | 10/2006 |
| WO | WO 2009/158226 A2 | 12/2009 |

OTHER PUBLICATIONS

Meissner et al., "Battery Monitoring and Electrical Energy Management Precondition for future vehicle power systems," Journal of Power Sources, 2003, vol. 116, pp. 79-98.
International Search Report issued in International Patent Application No. PCT/FR2011/000051 dated May 19, 2011.

\* cited by examiner

*Primary Examiner* — Sujoy Kundu
*Assistant Examiner* — Elias Desta
(74) *Attorney, Agent, or Firm* — Oliff & Berridge, PLC

(57) ABSTRACT

A method for diagnosing the state of health of a battery includes, determining a first state-of-charge value from the battery voltage during partial discharge at constant current, determining a second state-of-charge value from the open circuit voltage of the battery, and calculating the state of health from the difference between the first and second state-of-charge values.

8 Claims, 4 Drawing Sheets

METHOD FOR DIAGNOSING THE STATE OF HEALTH OF A BATTERY

BACKGROUND OF THE INVENTION

The invention relates to a method for diagnosing the state of health (SOH) of a battery.

STATE OF THE ART

Energy storage requires regular supervision of the batteries by means of tests to determine the faulty batteries. The inability of a battery to provide the required power is a first indication of its deterioration. Testing a battery can be performed by determining its state of health (SOH). The state of health SOH is generally representative of the condition of a battery, of its deterioration or of its ability to provide the required current.

The state of health can be expressed by the discharge capacity $C_D$ normalized to the nominal capacity of the battery $C_N$. The discharge capacity $C_D$ represents the quantity of energy a battery can undergo on discharge after it has been fully charged. Therefore, the closer the discharge capacity is to the nominal capacity of the battery, the better its state of health is. According to this definition, the state of health is written by the following relationship:

$$SOH = 100 \cdot \frac{C_D}{C_N} \tag{R1}$$

A decrease of the state of health represents an irreversible loss of capacity due to different degradation phenomena such as sulfatation of the battery. The SOH is determined, in conventional manner, by full discharging a battery that has previously been fully charged. The discharge current is constant and traditionally equal to $C_N/20$ h, with $C_N$ the rated capacity of the battery.

Using this definition directly to measure the state of health of a battery is not able to be applied in a real situation. It would in fact be necessary to regularly perform discharging of each battery of a pool for twenty hours, which reduces the utilization efficiency of the pool.

Conventional methods for quick testing the state of health perform measurement of the open circuit voltage (OCV) and measurement of the internal resistance of the battery from AC signals of weak amplitude or from square wave current pulses.

The document U.S. Pat. No. 4,912,416 describes one of these battery testing devices. The device measures the dynamic conductance of a battery (i.e. the inverse of the internal resistance), representative of its electric condition. The conductance of the battery being dependent on its state of charge (SOC), the state of charge is also evaluated to correct the conductance value. The state of charge is generally determined by measuring the open circuit voltage $V_{CO}$ at the terminals of the battery.

These techniques for testing the state of health do however present drawbacks. The open circuit voltage used to determine the state of charge is an approximate representation of the state of health of the battery. A charged battery having a low SOH can in fact have a substantially equal, or even higher, open circuit voltage than a new battery. Furthermore, the internal resistance of a battery only takes account of the ohmic components of the battery. The resistances of the metal current collectors, the electrolyte volume and the resistance of the active materials not taking part in the reactions are not taken into account in measurement of the internal resistance. The charge transfer resistance is for example omitted.

By contrast, measurement takes account of the so-called contact resistances corresponding to the connections with the testing device. If the quality of the contact is poor, the error on measurement may be significant.

SUMMARY OF THE INVENTION

An object of the invention is to provide a method for diagnosing the state of health that is simple, quick and does not require extensive discharge of the battery.

According to the invention, this object tends to be satisfied by the fact that the method determines a first state-of-charge value from the battery voltage during partial discharge at constant current and a second state-of-charge value from the open circuit voltage of the battery, and by the fact that the state of health is determined from the difference between the first and second state-of-charge values.

BRIEF DESCRIPTION OF THE DRAWINGS

Other advantages and features will become more clearly apparent from the following description of particular embodiments given for non-restrictive example purposes only and illustrated by means of the appended drawings, in which.

DESCRIPTION OF A PREFERRED EMBODIMENT OF THE INVENTION

Figure 1:
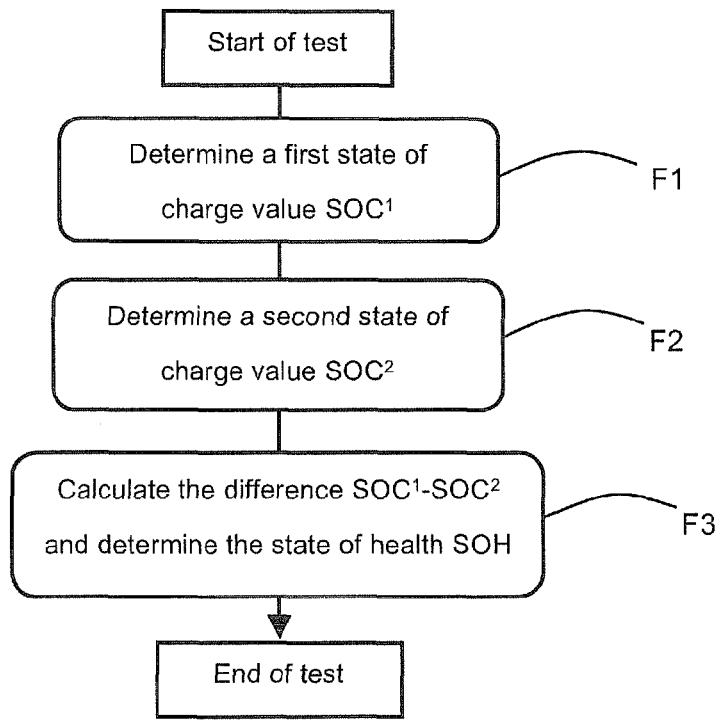
FIG. 1 represents steps of a method for diagnosing the state of health according to the invention.

The state of charge (SOC) represents the quantity of electricity (expressed in Ah) stored in a battery normalized to the maximum quantity that can be stored after a full charge of the battery. Two techniques can be used to determine the state of charge SOC of a battery.

A first technique consists in measuring the voltage at the terminals of the battery when partial discharge of the battery is performed at constant current. The voltage value enables the state of charge of the battery to be determined by means of look-up tables. The look-up tables (such as the one represented in FIG. 3) are generally established by measuring the discharged quantity $Q_D$ by amperometry.

The state of charge $SOC^1$ thus determined can in fact be written in the following manner:

$$SOC^1 = 100 \cdot \frac{(C_D - Q_D)}{C_D}, \tag{R2}$$

where $C_D$ is the maximum discharge capacity and $Q_D$ the quantity of energy discharged ($C_D$ and $Q_D$ in Ah). This first SOC value is therefore normalized to the discharge capacity $C_D$.

A second technique for determining the state of charge uses measurement of the voltage of the battery in open circuit $V_{CO}$. In the case of lead-acid batteries, this technique is based on the quasi-linear relationship between the sulfuric acid concentration in the electrolyte (or the density of the electrolyte) and the electro-motive force E of the battery. After a sufficiently long relaxation time after opening of the circuit, the open circuit voltage $V_{CO}$ at the terminals of the battery stabilizes at a value close to electromotive force E of the battery. The sulfuric acid of the electrolyte is moreover an active component of the battery, which is consumed when discharging takes place and regenerated when charging is performed. The acid concentration is thus proportional to the state of charge SOC of the battery. A quasi-linear relationship between state of charge SOC and open circuit voltage $V_{CO}$, called equilibrium voltage, is thus obtained. This relationship is explained for example in the article "Battery monitoring and electrical energy management precondition for future vehicle electric power systems" (Meissner et al., Journal of Power Sources, 116, 79-98, 2003).

When the state of charge is determined by measurement of the open circuit voltage $V_{CO}$ at equilibrium, it can be expressed by the following relationship:

$$SOC^2 = 100 \cdot \frac{(C_N - Q_D)}{C_N}, \quad (R3)$$

with $C_N$ the nominal capacity of the battery and $Q_D$ the quantity of discharged energy.

The state of charge according to relationship R3 is normalized with respect to the nominal capacity $C_N$ as the maximum state of charge corresponds to the maximum sulfuric acid concentration (or the electrolyte density).

It has been discovered by the inventors that the state of health (SOH) of a battery can be estimated by means of these two measurements of the state of charge. The relationship R2 expressing the first the state-of-charge value $SOC^1$ does in fact comprise information on the state of health SOH of the battery as the discharge capacity $C_D$ varies according to the deterioration of the battery. For example, the capacity $C_D$ decreases in time if the battery is subjected to corrosion phenomena of the grids or degradation phenomena of the active material of the battery. By contrast, relationship R3 expressing the second value $SOC^2$ does not take account of ageing of the battery, i.e. this relationship is reliable if the battery is sealed (maintenance-free) or if maintenance of the battery is performed regularly. Second value $SOC^2$ therefore reflects information on the initial state of the battery. These two methods for calculating the state of charge therefore do not give the same value depending on the state of health of the battery.

It is possible to find the definition of the state of health according to the relationship R1 by a relationship based on the difference between $SOC^2$ and $SOC^1$.

According to relationships R2 and R3, the difference $SOC^2 - SOC^1$ is written:

$$\Delta SOC = SOC^2 - SOC^1 = 100 \cdot \left[ \frac{(C_N - Q_D)}{C_N} - \frac{(C_D - Q_D)}{C_D} \right] \quad (R4)$$

Relationship R4 is simplified in the following manner:

$$\Delta SOC = 100 \cdot Q_D \cdot \left( \frac{1}{C_D} - \frac{1}{C_N} \right) = 100 \cdot \frac{Q_D}{C_D} \cdot \left( 1 - \frac{C_D}{C_N} \right) \quad (R5)$$

With $$\frac{C_D}{C_N} = \frac{SOH}{100}$$

according to relationship R1 and $$\frac{Q_D}{C_D} = 1 - \frac{SOC^1}{100}$$

according to relationship R2, we obtain:

$$SOH = 100 - \frac{100 \cdot (SOC^2 - SOC^1)}{100 - SOC^1} \quad (R6)$$

A relationship is thus established enabling state of health SOH to be calculated from the difference between two state-of-charge values. The state-of-charge values are determined by means of different techniques without requiring a full charge-discharge cycle. It is proposed to put this observation into practice by means of a diagnosis method described below.

FIG. 1 represents generic steps of a method for diagnosing the state of health SOH of a battery. In a step F1, a first state-of-charge value $SOC^1$ of the battery is determined from the voltage $V_D$ obtained after partial discharge of the battery at constant current. In F2, a second state-of-charge value $SOC^2$ is determined from the open circuit voltage $V_{CO}$ of the battery. In F3, the difference $SOC^2 - SOC^1$ is calculated then used to determine the state of health SOH by means of relationship R6.

Figure 2:
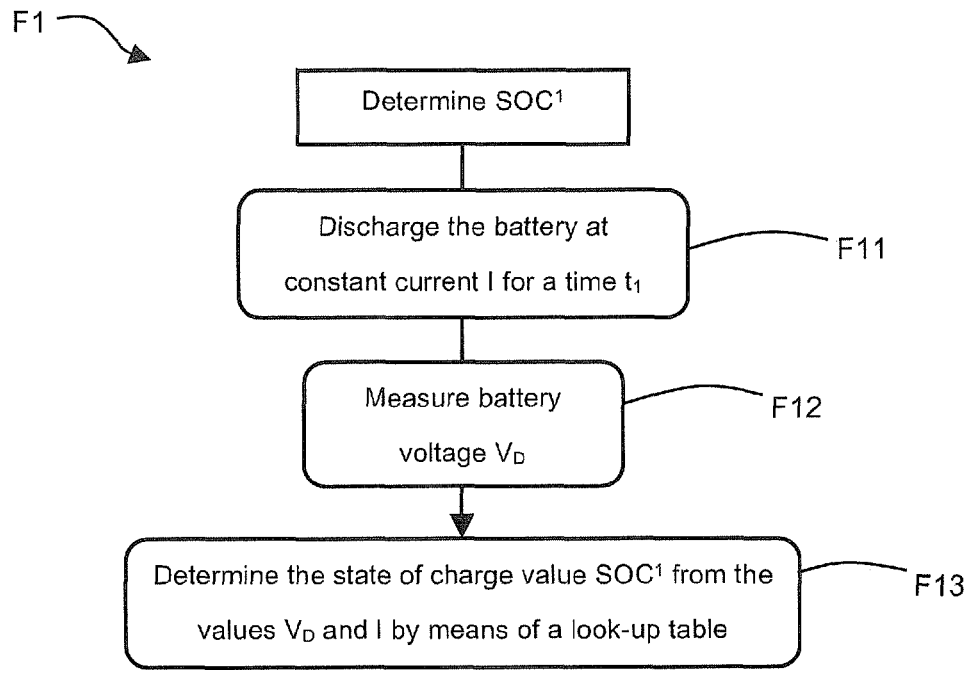
FIG. 2 represents a detailed step of the method according to FIG. 1, FIGS. 3 and 4 represent the voltage $V_{cell}$ at the terminals of an electrochemical test cell during continuous discharge at constant current and during a discharge at constant current interrupted by open circuit periods.

FIG. 2 represents a detailed example of step F1 of the diagnosis method of FIG. 1. In a step F11, the battery is discharged for a time period $t_1$ by a constant current I. In a step F12, the voltage $V_D$ at the terminals of the battery is measured at the end of discharging. In step F13, a look-up table is used, established beforehand by means of standard batteries and providing the state-of-charge values $SOC^1$ according to the different discharge voltages $V_D$ and different current densities. The first state-of-charge value $SOC^1$ is thus obtained by reading the look-up table for the discharge voltage $V_D$ measured in F12 and discharge current I applied in F11.

The discharge current I can be comprised between $C_N/10$ h and $C_N/1$ h, $C_N$ being the nominal capacity of the battery. Current I is preferably comprised between $C_N/5$ h and $C_N/3$ h. The discharge time $t_1$ is chosen such that the decrease of charge of the battery is comprised between 0.5% and 2%. The quantity of energy consumed for testing therefore remains limited and subsequent use of the battery is preserved. Discharge time $t_1$ is comprised between 20 seconds and 10 minutes, preferably between 1 and 3 minutes. For example purposes, a test discharge for a duration of 3 minutes at a current of $C_N/5$ h discharges 1% of the capacity of the battery.

Figure 3:
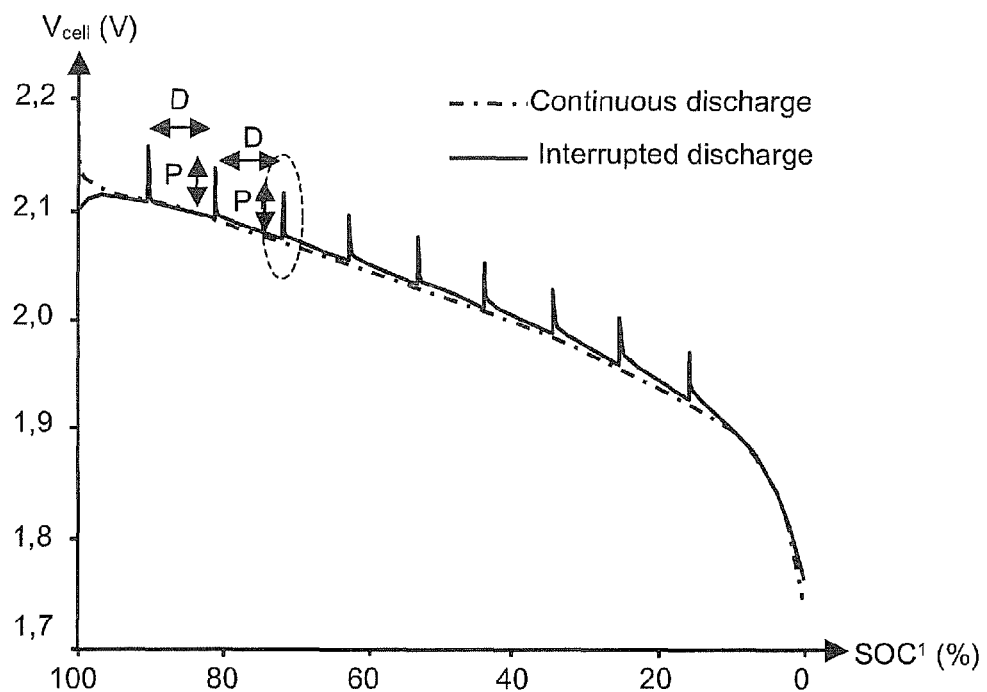

FIG. 3 represents the voltage $V_{cell}$ at the terminals of an electrochemical battery cell according to two types of discharge. The cell used for these experimental tests is a Valve Regulated Lead-Acid Battery (VRLAB) cell supplied by the manufacturer Sonnenschein. This cell comprises an electrolyte in the form of a gel and its nominal capacity is about 10 A.h.

The broken-line curve represents a continuous discharge at current constant of 1 A conventionally performed to determine the state of charge $SOC^1$. During this continuous discharge, cell voltage $V_{cell}$ varies in quasi-linear manner for state-of-charge values $SOC^1$ comprised between 20% and 90%. The slope of the curve is about 2.3 mV/% for one cell. A measured value of $V_{cell}$ can be associated with a state-of-charge value $SOC^1$ with a precision of about 0.5% to 1%.

The solid-line curve represents the variation of cell voltage $V_{cell}$, under experimental conditions, according to the diagnosis method represented in FIG. 1 to determine each of the state-of-charge values $SOC^1$ and $SOC^2$. Discharging D of the battery is interrupted by periods P during which the supply circuit is open. To compare the aspects of the two curves, the duration of periods P has been represented as being zero, and only the voltage variation on each period P can be observed in FIG. 3. A discharge period D at constant current of 1 A enables an evaluation of value $SOC^1$ according to step F1 (FIG. 2) whereas an open circuit period P enables an evaluation of value $SOC^2$ according to step F2, which will be explained in the following by means of FIG. 5. Each open circuit period P corresponds to a voltage peak of the cell. When disconnection of the cell takes place after a discharge, open circuit voltage $V_{CO}=V_{cell}$ in fact increases to an equilibrium value. Discharge D then restarts from this value. FIG. 3 shows that in the case of interruptions of the discharge (solid-line curve), without taking account of the duration of the interruptions, the voltage of the cell remains close to the discharge voltage without interruptions (broken-line curve plot).

Figure 4:
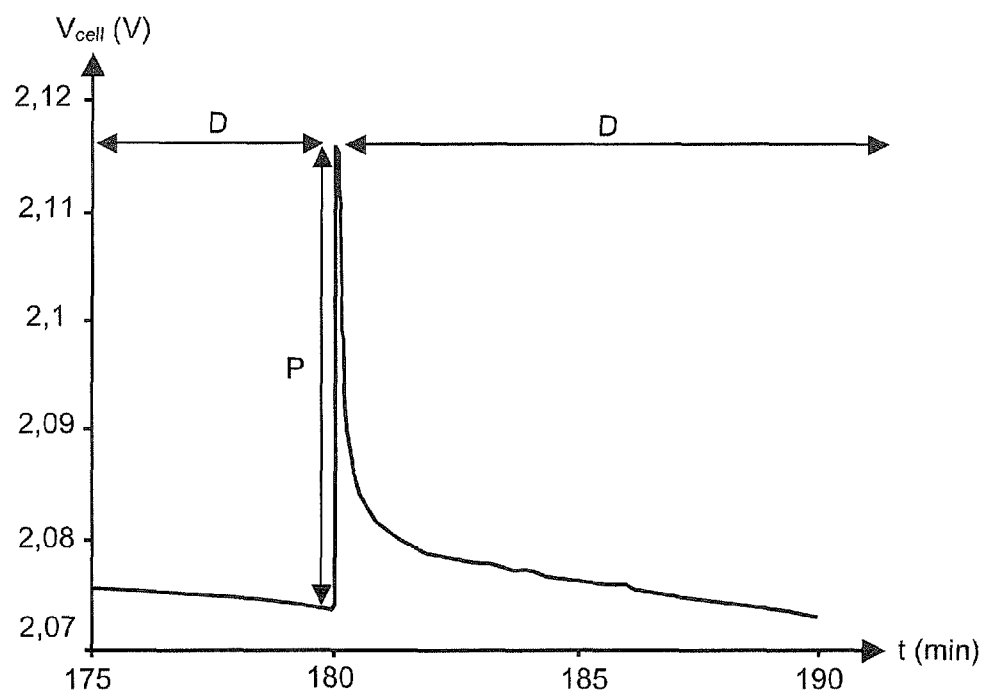

FIG. 4 represents an open circuit period P followed by a discharge period D, in enlarged view, at a state-of-charge value $SOC^1$ of about 72%. After opening of the supply circuit and stabilization of the voltage at the terminals of the cell, voltage $V_{cell}$ is at its maximum. When discharging D resumes, the voltage decreases rapidly and in a few minutes reaches a value close to the value obtained in the case of uninterrupted discharge.

FIGS. 3 and 4 therefore show that temporary disconnection of the battery for the purposes of evaluating the value $SOC^2$ has little influence on the cell voltage $V_D=V_{cell}$ during discharge D, and therefore on determination of the first state-of-charge value $SOC^1$. The method for diagnosing the state of health can therefore be used several times in reliable manner, as schematized in FIG. 3.

Figure 5:
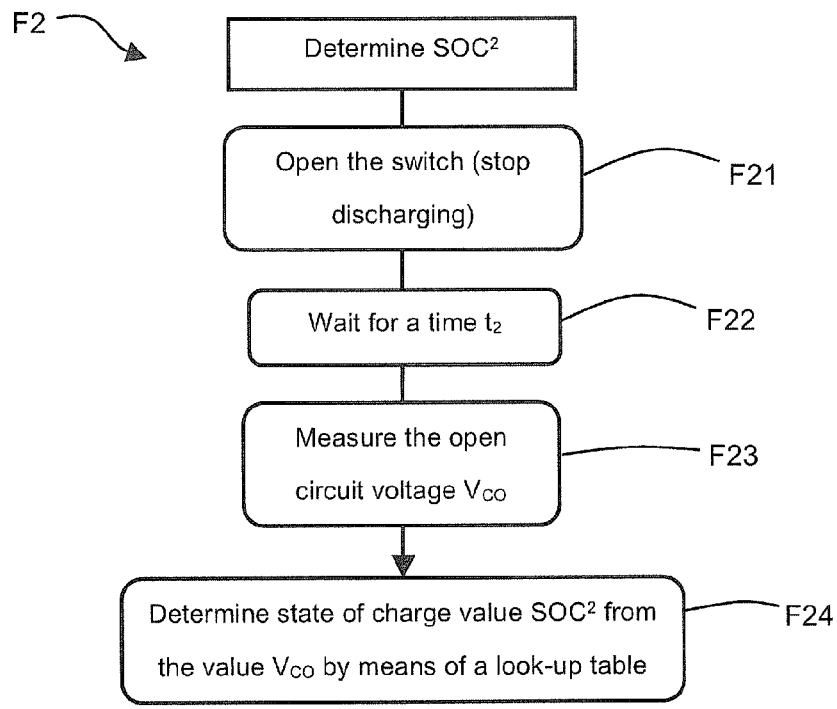
FIG. 5 represents a detailed step of the method according to FIG. 1.

FIG. 5 represents a detailed example of step F2 of determining the second state-of-charge value $SOC^2$. The discharge of step F1 is followed by opening of the circuit in a step F21. The state of the circuit remains unchanged during a time period $t_2$ (step F22). During this period, open circuit voltage $V_{CO}$ reaches an equilibrium state, i.e. a value close to electromotive force E of the battery. Finally, open circuit voltage $V_{CO}$ at equilibrium is measured (step F23) and used in a second look-up table in a step F24. This look-up table groups open circuit voltage values $V_{CO}$ at equilibrium of a standard battery in correspondence with state-of-charge values $SOC^2$.

As described in the foregoing, the open circuit voltage $V_{CO}$ or no-load voltage reaches a stationary state after a relaxation time. To enable precise evaluation of state of charge $SOC^2$, the step of measuring voltage $V_{CO}$ is generally performed after a waiting time of two hours after disconnection of the battery. This waiting time is obviously too long for implementation in a commercial battery pool. A solution to shorten this time will be seen in the following.

Figure 6:
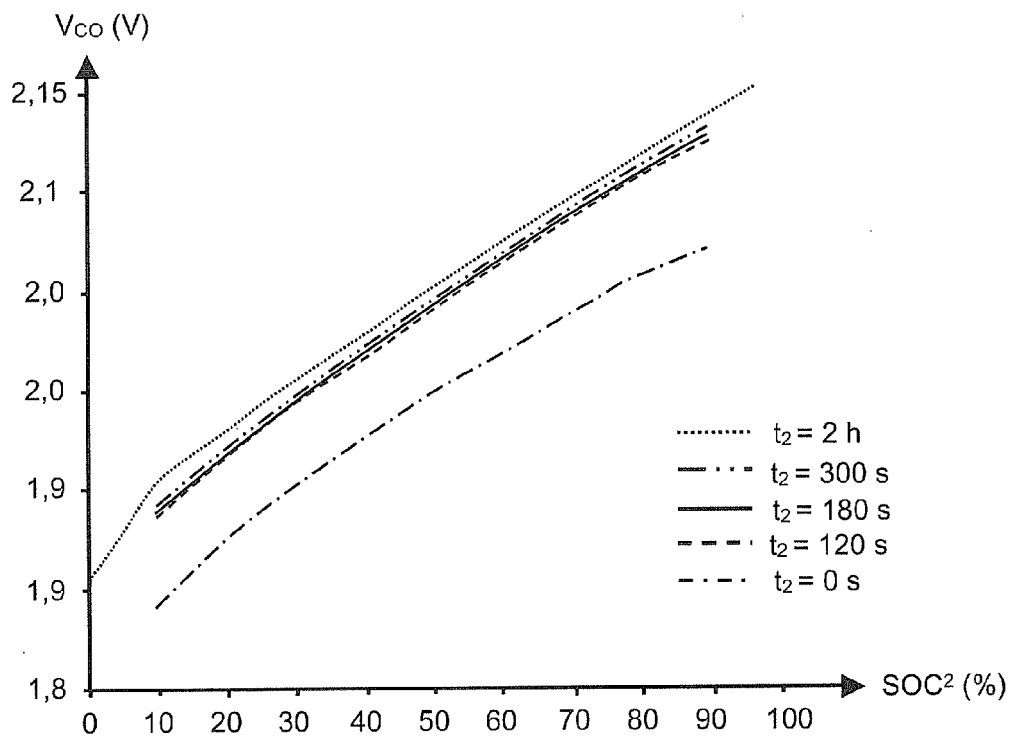
FIG. 6 represents the open circuit voltage $V_{CO}$ of the cell versus its state of charge $SOC^2$, for different relaxation times $t_2$ of the battery, and FIG. 7 schematically represents a testing device for implementing the method according to the invention.

FIG. 6 represents open circuit voltage $V_{CO}$ of the cell described in the foregoing according to state of charge $SOC^2$ for relaxation $t_2$ times varying from 0 to 2 h. The maximum value of voltage $V_{CO}$ is reached for $t_2=2$ h. It can be noted that a relaxation time of about 120 seconds enables a no-load voltage value of about 90% of the maximum value to be achieved.

Waiting time or relaxation time $t_2$ is thus preferably chosen between 120 and 300 seconds to minimize the duration of the diagnosis method and preserve a good precision. Open circuit voltage $V_{CO}$ is therefore preferably measured 120 to 300 seconds after the end of partial discharge and opening of the circuit.

The method for diagnosing the state of health is rapid as a few minutes suffice to calculate each of the state-of charge-values. For a partial discharge of about three minutes followed by an open circuit period of about two minutes, the method for diagnosing the state of health has a duration of about six minutes, including the time necessary for calculating the SOH value. Furthermore, the method does not discharge the battery significantly, as a discharge of 0.5% to 2% is sufficient to determine the first state-of-charge value $SOC^1$.

Figure 7:
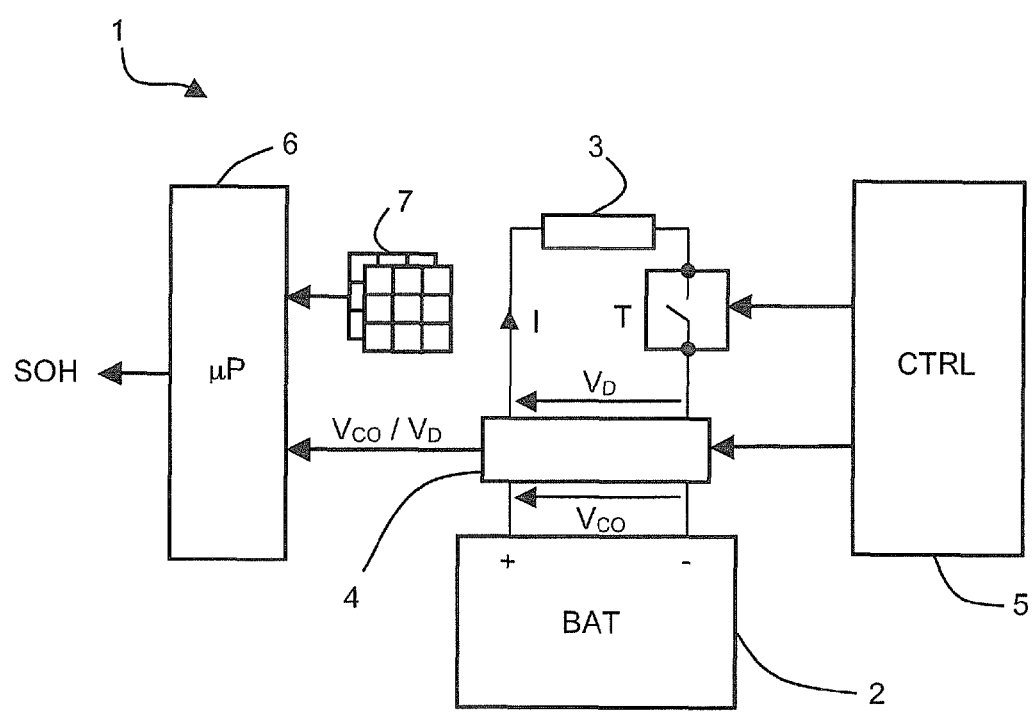

FIG. 7 represents a test device 1 for implementing the diagnosing method according to FIG. 1. A battery 2 is connected to a load 3, for example a resistance. A switch T is connected in series between the battery 1 and load 3 to place the battery 2 in open or closed circuit. The device further comprises a measuring circuit 4 of the voltage $V_D$ at the terminals of load 3 or of open circuit voltage $V_{CO}$. Measuring circuit 4 and switch T are controlled by a control unit 5.

Voltages $V_D$ and $V_{CO}$ are supplied by measuring circuit 4 to a calculator 6, for example a microprocessor. Calculator 6 determines the state of health SOH of battery 2 from voltages $V_D$ and $V_{CO}$ and look-up tables 7 contained in a memory.

Numerous variants and modifications will be apparent to the person skilled in the art. In particular, the method for diagnosing the state of health can be applied to a fully charged battery, to a partially or fully discharged battery.

The invention claimed is:

1. A method for diagnosing the state of health of a battery, comprising the following steps:
   partially discharging the battery at a constant current,
   measuring the battery voltage during partial discharging,
   determining a first state-of-charge value from the battery voltage during partial discharging,
   measuring the open circuit voltage of the battery and determining a second state-of-charge value from the open circuit voltage, and
   calculating, with a processor, the state of health from the difference between the first and second state-of-charge values.

2. The method according to claim 1, wherein the state of health SOH is calculated from the relationship $$SOH = 100 - \frac{100 \cdot (SOC^2 - SOC^1)}{100 - SOC^1},$$

where $SOC^1$ is the first state-of-charge value and $SOC^2$ is the second state-of-charge value.

3. The method according to claim 1, wherein the partial discharge current is comprised between $C_N/10$ h and $C_N/1$ h, $C_N$ being the nominal capacity of the battery.

4. The method according to claim 3, wherein the partial discharge current is comprised between $C_N/5$ h and $C_N/3$ h.

5. The method according to claim 1, wherein partial discharge takes place during a time period such that the decrease of the charge of the battery is comprised between 0.5% and 2%.

6. The method according to claim 1, wherein partial discharge takes place during a time period comprised between 20 seconds and 10 minutes.

7. The method according to claim 6, wherein the partial discharge time period is comprised between 1 minute and 3 minutes.

8. The method according to claim 1, further comprising
    disconnecting the battery during a time period comprised between 60 and 300 seconds, before
   measuring the open circuit voltage of the battery.

* * * * *